United States Patent [19]

Gongwer

[11] Patent Number: 5,023,486
[45] Date of Patent: Jun. 11, 1991

[54] LOGIC OUTPUT CONTROL CIRCUIT FOR A LATCH

[75] Inventor: Geoffrey S. Gongwer, San Jose, Calif.

[73] Assignee: Atmel Corporation, San Jose, Calif.

[21] Appl. No.: 502,221

[22] Filed: Mar. 30, 1990

[51] Int. Cl.$^5$ .................................. H03K 3/356
[52] U.S. Cl. .......................... 307/465; 307/272.2; 307/469; 307/481; 365/154
[58] Field of Search ........................ 307/451–452, 307/465, 468, 469, 481, 584–585

[56] References Cited

U.S. PATENT DOCUMENTS

| | | | |
|---|---|---|---|
| 4,019,144 | 4/1977 | Lincoln et al. | 328/92 |
| 4,158,891 | 6/1979 | Fisher | 365/222 |
| 4,495,628 | 1/1985 | Zasio | 307/272.2 X |
| 4,506,167 | 3/1985 | Little et al. | 307/272.2 X |
| 4,624,006 | 11/1986 | Rempfer et al. | 307/451 X |
| 4,638,183 | 1/1987 | Rickard et al. | 307/468 X |
| 4,669,061 | 5/1987 | Bhavsar | 365/154 |
| 4,703,200 | 10/1987 | Zangava | 307/481 X |
| 4,706,217 | 11/1987 | Shimizu et al. | 365/154 |
| 4,717,912 | 1/1988 | Harvey et al. | 340/825.83 |
| 4,728,823 | 3/1988 | Kinoshita | 307/451 |
| 4,791,602 | 12/1988 | Resnick | 364/900 |
| 4,820,939 | 4/1989 | Sowell et al. | 307/272.2 X |
| 4,849,935 | 7/1989 | Miyazawa | 365/189.05 |

Primary Examiner—David Hudspeth
Attorney, Agent, or Firm—Thomas Schneck; Mark Protsik

[57] ABSTRACT

A logic output control circuit for selecting between stored and nonstored outputs from a data input and a clock having a data pass gate MOS transistor receiving a logic signal at its data input and either blocking the signal or passing it to a cross-coupled inverter gate latch depending on a control signal at its control gate terminal. The control signal is derived in one embodiment by a logic gate with a programming signal input, a clock input and a control signal output, and in a second embodiment by a set of pass gate transistors respectively receiving a clock signal and a fixed level signal and controlled by a programming signal. When the programming signal has one logic level, the data pass transistor is always on and the logic signal flows continually to the output. When the programming signal has the other logic level, the data pass transistor switches on and off with the clock signal and the circuit operates as a latch. The clock signal may be an input clock or a pulsed clock which is an edge triggered version of the pin clock signal.

12 Claims, 2 Drawing Sheets

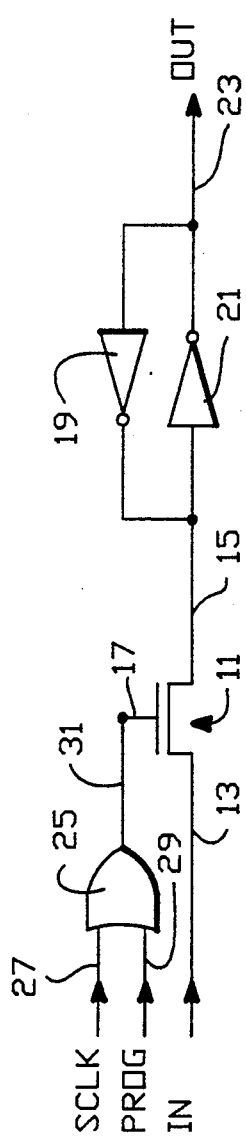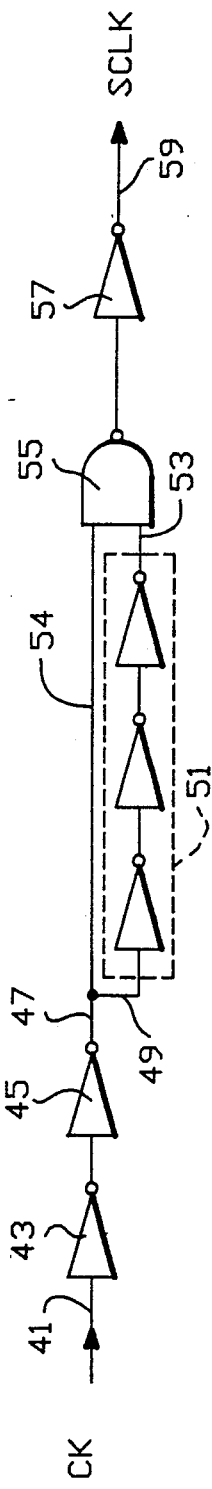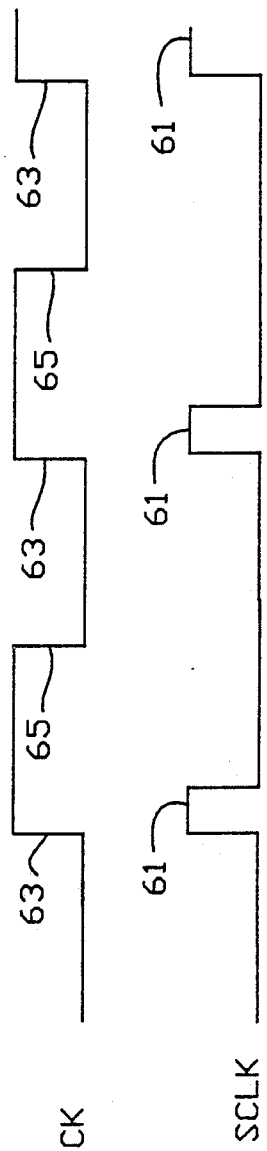

LOGIC OUTPUT CONTROL CIRCUIT FOR A LATCH

DESCRIPTION

1. Technical Field

The present invention relates to multifunctional or programmable circuits for providing a selected one of a plurality of possible types of output signals from a single data input signal, and in particular to circuits capable of producing either a stored or nonstored output from a nonstored data input.

2. Background Art

In U.S. Pat. No. 4,717,912, Harvey et al. describe an integrated circuit package having a plurality of pins and housing a chip on which a logic circuit is implemented. The architecture of the chip also includes a plurality of individually programmable output structures, each having an input connected to receive a logic signal from the logic circuit, and each having an output connected to provide an output signal to one of the pins. The output structure has a register or other storage device and a conductive line, both connected to its input, for providing stored and nonstored versions of the logic signal on its input. In one embodiment, inverters provide inverted versions of the stored and nonstored signals, then a 4:1 programmable multiplexer selects one of the four provided signals for output onto a pin. In another embodiment, a 2:1 programmable multiplexer selects either one of the stored or nonstored signals provided to it, and then a programmable XOR gate inverts or lets pass the selected signal for coupling to a pin.

In U.S. Pat. No. 4,019,144, Lincoln et al. describe a conditional latch circuit which is selectively operable either as a latch or as an OR gate. The circuit, seen in FIG. 5, comprises an OR gate 101 having at least three inputs connected to the outputs of separate AND gates 102–104, and an additional AND gate 105 with a noninverted output connected to an input of one of the separate AND gates 104, and an inverted output connected to an input of each of the other separate AND gates 102 and 103. The AND gate 104 connected to the noninverted output has another input that is connected to the output of the OR gate 101. With one input of the additional AND gate 105 connected to a clock, the circuit will behave as a latch, when the other programmed input of gate 105 is in a binary "1" state. When the programmed input is in a binary "0" state, the circuit will operate as an OR circuit to logically sum two or more data input signals D1 and D2 of gates 102 and 103. An exclusive-OR gate 106 may be provided to invert or not invert the output from OR gate 101.

A circuit is desired that has a low element count and a short data path with few parasitics for speed, while still being able to process an input signal to provide either a stored or nonstored output signal. Such an improved circuit would have special value for configurable logic devices, which demand high performance and tighter speed constraints.

Accordingly, an object of the invention is to provide a simple, high speed circuit for providing a stored or nonstored output signal from a single data input and a clock, as selected by a user.

DISCLOSURE OF THE INVENTION

The above object has been met with a circuit which includes a transistor pass gate connecting a data input to an inverter gate pair that is in a cross-coupled feedback loop configuration. The pass gate is controlled by a pulsed clock signal that may be enabled or disabled by a programmed signal. When the programmed signal is in one state, the clock signal alternately enables and disables the pass gate, and the circuit operates as a latch. When the programmed signal is in another state, the pass gate is always on, and inputs flow unstored through to the output.

Viewed from the circuit output, the result is the same as multiplexing, but the way in which selecting of the output signal type is done differs from multiplexing in that there is only a single nonstored input data signal and the pass transistor control selects whether to store or not to store that signal before it is output.

BRIEF DESCRIPTION OF THE DRAWINGS

FIG. 1 is a schematic view of logic circuit of the present invention.

FIG. 2 is a schematic view of a sample clock pulse generating circuit for use with the logic circuit of FIG. 1.

FIG. 3 is a timing diagram of clock input signals CK and sample clock output signals SCLK of the circuit in FIG. 2.

BEST MODE FOR CARRYING OUT THE INVENTION

Figure 4:
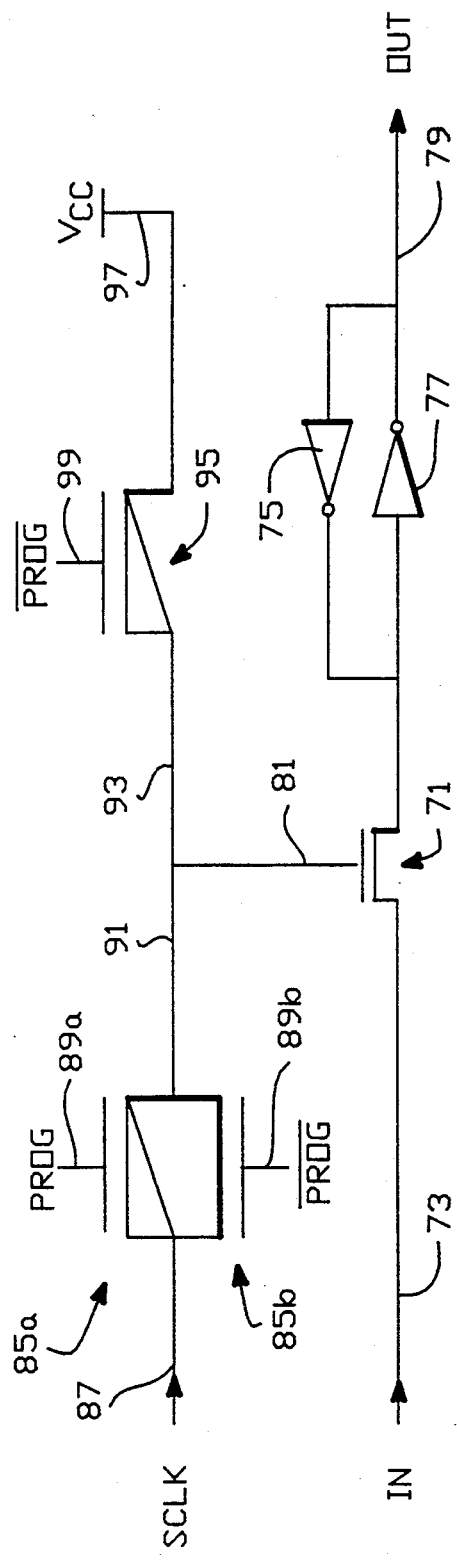
FIG. 4 is a schematic view of an alternative logic circuit of the present invention.
Figure 5:
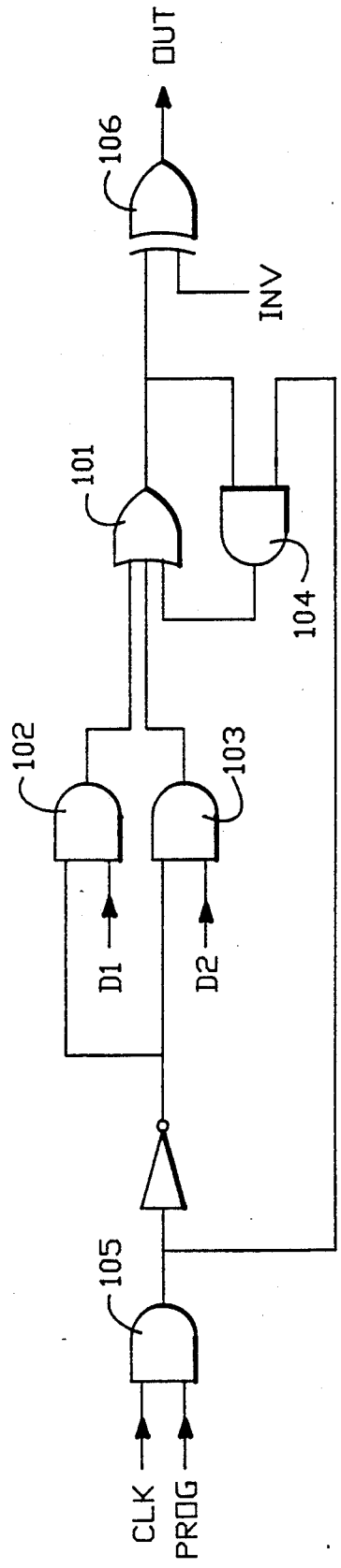
FIG. 5 is a schematic view of a prior art logic circuit.

With reference to FIG. 1, a logic output control circuit of the present invention includes a MOS transistor pass gate or switch 11 having a data input terminal 13 for receiving a logic input signal IN and a data output terminal 15. Terminals 13 and 15 generally make connections to source and drain implants of the pass gate transistor 11. Pass gate 11 also includes a control input terminal 17, which generally makes connection to a gate of the pass gate transistor 11, for receiving a control signal. Pass gate 11 passes the logic signal IN on the data input 13 to the data output 15, whenever the control signal or terminal 17 is in a first signal state, and blocks the logic signal IN at the data input 13, whenever the control signal on terminal 17 is in a second signal state. For an n-channel enhancement mode MOS transistor, shown here, the first signal state is logic level HIGH and the second signal state is logic level LOW. The signal states and logic levels are reversed for p-channel enhancement mode transistors.

The circuit also includes a pair of inverter logic gates 19 and 21 cross-coupled together in a feedback loop configuration. This means that an input of one inverter 21 is connected to an output of the other inverter 19, and vice versa. In this case, the inverter 21 input and inverter 19 output are both connected to output terminal 15 of pass gate 11, while the inverter 19 input and inverter 21 output are connected together to form a circuit output 23 for carrying an output signal OUT. This pair forms a bistable latching element in which the logic signal at terminal 15 can freely pass to output 23 and where the logic level on circuit output 23 is the complement of the logic level on terminal 15. If desired an additional inverter, not shown, may follow the inverter pair to provide an output signal OUT which is not an inversion of input signal IN.

The circuit further includes a programmable logic gate, such as two-input OR gate 25, for providing the control signal to control input terminal 17 of pass gate 11. The programmable logic gate 25 includes a clock signal input terminal 27 for receiving a clock signal SCLK, a programming signal input terminal 29 for receiving a programming signal PROG and an output terminal 31 connected to control input terminal 17.

If the programming signal PROG on terminal 29 has a first program value, the resulting control signal or output terminal 31 should be continuously in the first logic state, but if the programming signal PROG has a second program value, the control signal should alternately switch between the first and second logic states in response to clock signal SCLK on terminal 27. For example, if the programmable logic gate 25 is an OR gate, as shown, or a NOR gate, then the first program value would be logic level HIGH and the second program value would be logic level LOW. If, however, the programmable logic gate 25 were to be a NAND gate or an AND gate, the first and second program values would be reversed, that is, a logic level LOW program value would fix the logic state of the control signal output by the gate 25 and a logic level HIGH program value would permit switching of logic states for the control signal in response to the clock signal SCLK.

When the control signal on control input terminal 17 of pass gate 11 is fixed so that pass gate 11 is always on, the logic signal IN on data input terminal 13 is continuously passed through the inverter gate 21 to circuit output 23. An unstored output signal is thus obtained. Alternatively, when the control signal on control input terminal 17 is alternately switching between HIGH and LOW logic states in response to clock signal SCLK, as when programming signal PROG is logic level LOW and gate 25 is an OR-gate, then the pass gate 11 switches on and off and repeatedly latches the logic signal IN onto the pair of inverter logic gates 19 and 21. During the time period when pass gate 11 is off, the logic signal is stored by the inverter pair and so is available to the circuit output 23.

With reference to FIG. 2, the clock signal SCLK is preferably a pulsed clock signal, that is, has a very low duty cycle. Accordingly, the logic output control circuit of the present invention typically includes a sampling clock generating circuit for generating a low duty cycle pulsed clock signal SCLK from a clock signal CK on a clock pin input 41. The generating circuit includes an input 41 for receiving clock signal CK from a pin. Input 41 may comprise a simple conductive line or may also include a buffer-driver circuit or a pair of inverters 43 and 45 connected in series as shown. The generating circuit also includes a delay circuit 51 having an input terminal 49 connected to an output 47 of the inverter 45. Delay circuit 51 typically comprises a series of buffers, inverters or both. The number of buffer and inverter elements in the series will determine the propagation delay time between the input terminal 49 and the output terminal 53 of delay circuit 51. The generating circuit also includes a logic gate 55, shown here as a NAND gate followed by an inverter/driver 57. One input 59 of the NAND gate 55 connects to the output 47 of input inverter 45, while the other input connects to output terminal 53 of delay circuit 51. NAND gate 55 and inverter 57 together logically combine the two inputs to provide an output 59 that carries a low duty cycle or "pulsed" clock signal SCLK.

With reference to FIG. 3, the clock signal CK at input 41 in the circuit of FIG. 2 is shown with a 50% duty cycle. Likewise, the resulting pulsed clock signal SCLK at output 59 is shown having a much lower duty cycle. With the particular circuit shown in FIG. 2, the pulsed clock signal SCLK has logic level HIGH pulses 61 located at the leading or rising edge 63 the input clock signal CK. The duration of the pulse is typically about 2-5 ns for a 50 MHz clock signal CK. The pulse duration can be varied by adjusting the number or speed of phase delaying elements in delaying circuit 51. Pulsed signals at the trailing or falling edge 65 and pulses which are logic level LOW can also be created by changing logic gate 55 to another gate type, such as AND, OR, NOR or XOR, or by changing the delaying circuit from logic inverting to noninverting.

Referring again to FIG. 1, instead of having a pulsed clock signal generator circuit as in FIG. 2 to provide the clock signal SCLK, the clock signal SCLK may be supplied directly from a clock pin. This clock signal SCLK may be already of low duty cycle so that the logic output control circuit functions like an edge-triggered storage device, or may be of higher duty cycle so that the circuit functions as a level-triggered latch.

With reference to FIG. 4, an alternative embodiment of a logic output control circuit in accord with the present invention also has a data pass gate transistor 71 for passing or blocking a logic signal IN on an input terminal 73 to a cross-coupled pair of inverters 75 and 77. Again, when data pass gate transistor 71 is always ON, the logic signal IN flows continuously to the circuit output 79 to form an unstored output signal OUT, but when data pass gate transistor 71 alternately switches between on and off, the logic signal IN is latched into the inverter pair, from which it is available at circuit output 79. Like the previous embodiment in FIG. 1, the pass transistor 71 has a control input terminal 81 receiving a control signal and is responsive to the logic state of the control signal to turn on or off.

The circuit in FIG. 4 has a different programmable circuit for providing the control signal than the gate 25 of FIG. 1. The programmable circuit is essentially a 2:1 multiplexer with a fixed first logic state input and a clock input which selects by means of a programming signal PROG. A pair of pass transistors 85$a$ and 85$b$ are connected together in parallel to a clock signal input 87 carrying a clock signal SCLK. Transistors 85$a$ and 85$b$ also have programming signal inputs 89$a$ and 89$b$ carrying logically complementary programming signals PROG and $\overline{\text{PROG}}$. One pass transistor 85$a$ is a p-channel MOS transistor which is on when its programming signal input 89$a$ is logic level LOW and off when its programming signal input 89$a$ is logic level HIGH. The other pass transistor 85$b$ is an n-channel mode MOS transistor which is on when its programming signal input 89$b$ is logic level HIGH and off when its programming signal input 89$b$ is logic level LOW. Since the programming signals PROG and $\overline{\text{PROG}}$ on inputs 89$a$ and 89$b$ are logically complementary, the two pass transistors 85$a$ and 85$b$ are simultaneously on or simultaneously off. Thus, when programming signal PROG has a program value which is logic level HIGH, both pass transistors 85$a$ and 85$b$ are off and clock signal SCLK at input 87 is blocked. But if programming signal PROG has a program value which is logic level LOW, both pass transistors 85$a$ and 85$b$ are on and clock signal SCLK at input 87 is passed to output 91 and thence to the control signal input 81 of pass transistor 71. The circuit then operates as a latch.

The control signal generating circuit in FIG. 4 also includes another pass transistor 95 with an output 93 connected to control signal input 81. Pass transistor 95 has an input 97 connected to a fixed voltage source of a logic level for which the data pass transistor 71 is on, here logic level HIGH. Pass transistor 95 also has a programming signal input 99 receiving a programming signal $\overline{PROG}$ such that it is on when gates 85a and 85b are off, and vice versa. Pass transistor 95 is typically a p-channel MOS transistor, as shown. If programming signal PROG has a program value which is logic level HIGH, signal $\overline{PROG}$ is logic level LOW and the resulting control signal input into data pass transistor 71 is fixed at logic level HIGH and data pass transistor 71 is continually on. Logic signal IN at input terminal 73 then flows continuously to circuit output 79 without storage.

As with the circuit in FIG. 1, the clock signal SCLK may be a low duty cycle pulsed clock signal, either input at a clock pin or generated by a circuit like that in FIG. 2. With the FIG. 4 embodiment a 50% duty cycle clock signal input is also possible for level-triggered operation.

With both embodiments, the programming signal PROG and its complement $\overline{PROG}$ may be provided by previous logic circuits, or may be mask, fuse, EPROM, or EEPROM programmed. The logic output control circuits may be used in both NMOS and CMOS integrated circuits and are particularly useful in programmable logic devices for selecting between stored and unstored outputs for each output pin.

I claim:

1. An output control circuit for a logic signal comprising,
   latching means having an input and an output for storing a logic signal received at said input, said logic signal being able to freely pass from said input to said output of said latching means whenever said logic signal is being received at said input, a stored logic signal being available from said latching means at said output whenever a logic signal is blocked from said input, said output of said latching means being coupled to a circuit output,
   switching means having an input and an output and responsive to a control signal for selectively passing a logic signal received at said input to said output whenever said control signal is in a first logic state and blocking said logic signal at said input whenever said control signal is in a second logic state, said input of said switching means being coupled to a circuit data input, said output of said switching means being connected to said input of said latching means, and
   programmable means having a program input and a clock input for providing said control signal to said switching means, said control signal being fixed in said first logic state whenever said program input has a first program value, said control signal alternately switching between said first and second logic state in response to a clock signal on said clock input whenever said program input has a second program value.

2. The circuit of claim 1 wherein said latching means comprises a pair of inverter logic gates cross-coupled together with an input of one inverter logic gate and an output of the other inverter logic gate connected together to form said latching means input and with an output of said one inverter logic gate and an input of said other inverter logic gate connected together to form said latching means output.

3. The circuit of claim 1 wherein said switching means comprises an MOS transistor with a source and drain forming said switching means input and output and a control gate forming means responsive to said control signal for switching said MOS transistor on and off.

4. The circuit of claim 1 wherein said programmable means comprises a two-input logic gate with an output providing said control signal, the logic state of said control signal being a logical function of logic levels of said program input and said clock input.

5. The circuit of claim 1 wherein said clock signal provided on said clock input is a low duty cycle pulsed clock signal.

6. The circuit of claim 1 further comprising means, having an input connected to receive a first clock signal and having an output connected to said clock input of said programmable means, for generating a low duty cycle pulsed clock signal from said first clock signal.

7. The circuit of claim 6 wherein said generating means comprises means connected to said generating means input for delaying said first clock signal and logic gate means, having a first input connected to said generating means input, a second input connected to an output of said delaying means and a logic gate output, for logically combining said first clock signal and delayed clock signal to provide said low duty cycle pulsed clock signal at said logic gate output.

8. The circuit of claim 1 wherein said programmable means comprises selecting means, having a first input connected to a source of a fixed voltage signal at said first logic state and having a second input connected to a source of a clock signal alternating between said first and second logic states, for providing at an output either said fixed voltage signal or said clock signal, said selecting means being responsive to a program input having a program value.

9. A circuit comprising,
   a transistor pass gate having a data input for receiving a logic signal, a data output and a control input for receiving a control signal, said pass gate passing said logic signal from said data input to said data output when said control signal is in a first signal state and blocking said logic signal on said data input when said control signal is in a second signal state,
   a pair of inverter logic gates cross-coupled together in a feedback loop configuration, with an input of one inverter logic gate and an output of the other inverter logic gate connected together to said data output of said transistor pass gate and with an output of said one inverter logic gate and an input of said other inverter logic gate connected together to a circuit output, and
   programmable means for providing said control signal to said control input of said transistor pass gate, said programmable means including a programming signal input and a clock signal input, said control signal provided by said programmable means being continuously in said first signal state if a programming signal on said programming signal input has a first program value, whereby said transistor pass gate continuously passes said logic signal on said data input through said inverter logic gates directly to said circuit output, but said control signal provided by said programmable means alternately switching between said first signal state and said second signal state in response to a clock signal on said clock signal input if said programming signal on said programming signal input has a second program value, whereby said transistor pass gate repeatedly latches said logic signal on said data input onto said pair of inverter logic gates from which it is available to said circuit output.

10. The circuit of claim 9 where said programmable means comprises a two-input logic gate having said programming signal input and said clock signal input forming input terminals thereof and having an output terminal connected to said control input of said transistor pass gate, said clock signal on said clock signal input being a low duty cycle pulsed clock signal.

11. The circuit of claim 9 further comprising means connected to said clock signal input for generating a low duty cycle pulsed clock signal from a first clock signal, said pulsed clock signal generating means including input means for receiving said first clock signal means, having an input terminal connected to an output of said input means and an output terminal, for delaying said first clock signal received at said input terminal, and logic gate means, having a first input connected to said output of said input means, having a second input connected to said output terminal of said delaying means and having an output connected to said clock signal input, for logically combining said first clock signal at said first input and said delayed signal at said second input to provide said low duty cycle pulsed clock signal at said output.

12. The circuit of claim 9 wherein said programmable means comprises first, second and third pass transistor means all connected to said control input of said transistor pass gate, said first and third pass transistor means also connected to said clock signal input for providing said clock signal on said clock signal input to said control input, said second pass transistor means also connected to a source of a fixed voltage signal in said first signal state for providing said fixed voltage signal to said control input, said first pass transistor means responsive to a programming signal and said third pass transistor means responsive to an inverted state of said programming signal so as to be operative when said programming signal has said second program value, said second pass transistor means responsive to an inverted state of said programming signal so as to be operative when said programming signal has said first program value.

* * * * *